US006489613B1

(12) United States Patent
Mori et al.

(10) Patent No.: US 6,489,613 B1
(45) Date of Patent: Dec. 3, 2002

(54) OXIDE THIN FILM FOR BOLOMETER AND INFRARED DETECTOR USING THE OXIDE THIN FILM

(75) Inventors: Toru Mori, Tokyo (JP); Katsuya Kawano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/387,878

(22) Filed: Sep. 1, 1999

(30) Foreign Application Priority Data

Sep. 1, 1998 (JP) .......................................... 10-247419
Jul. 8, 1999 (JP) .......................................... 11-194502

(51) Int. Cl.$^7$ .............................................. H01L 31/09
(52) U.S. Cl. .................................. 250/338.1; 250/338.4
(58) Field of Search ........................... 250/338.1, 338.4, 250/332, 342

(56) References Cited

U.S. PATENT DOCUMENTS

| 5,286,976 A | | 2/1994 | Cole |
| 5,300,915 A | | 4/1994 | Higashi et al. |
| 5,801,383 A | * | 9/1998 | Wada et al. ................. 250/332 |
| 5,912,464 A | * | 6/1999 | Vilain et al. ............. 250/338.4 |
| 6,198,099 B1 | * | 3/2001 | Kim ........................ 250/338.1 |

FOREIGN PATENT DOCUMENTS

| JP | 5-206526 | 8/1993 |
| JP | 7-507141 | 8/1995 |
| JP | 9-145481 | 6/1997 |
| JP | 9-257565 | 10/1997 |
| JP | 11-83620 | 3/1999 |

OTHER PUBLICATIONS

"Preparation of Doped VO2 Single Crystals and Their Electrical Properties" by Shigenao Koide, et al., Central Research Laboratory Tokyo Shibaura (Toshiba) Electric Co., Ltd. pp. 27–32.
Undoped and Doped VO2 Films Grown From VO(OC3H7)3, by Charles Greenberg, Thin Solid Films, vol. 110 (1983), pp. 73–82.
European Journal of Solid State and Inorganic Chemistry, vol. 32, 1995, pp. 851–861.
Materials Research Bulletin, vol. 32, No. 8, pp. 1109–1117.
H. Kuwamoto, J.M. Honig et al. (Sep. 15, 1980) "Electrical properties of the (V1–xCRx)2 03 System", Physical Review B, vol. 22, No. 6, pp. 2626–2636.*

* cited by examiner

Primary Examiner—Constantine Hannaher
Assistant Examiner—Otilia Gabor
(74) Attorney, Agent, or Firm—Scully, Scott, Murphy & Presser

(57) ABSTRACT

An oxide thin film for bolometer having a vanadium oxide represented by $VO_x$, where x satisfies $1.5 \leq x \leq 2.0$, part of vanadium ion in the vanadium oxide being substituted by metal ion M, where the metal ion M is at least one of chromium (Cr), aluminum (Al), iron (Fe), manganese (Mn), niobium (Nb), tantalum (Ta) and titanium (Ti). Also, provided is an infrared detector having a bolometer thin film defined above. The oxide thin film for bolometer offers a low resistivity and a large TCR value. Also, the infrared detector offers a finer temperature resolution capability (NETD) as low as 0.03° C.

15 Claims, 8 Drawing Sheets

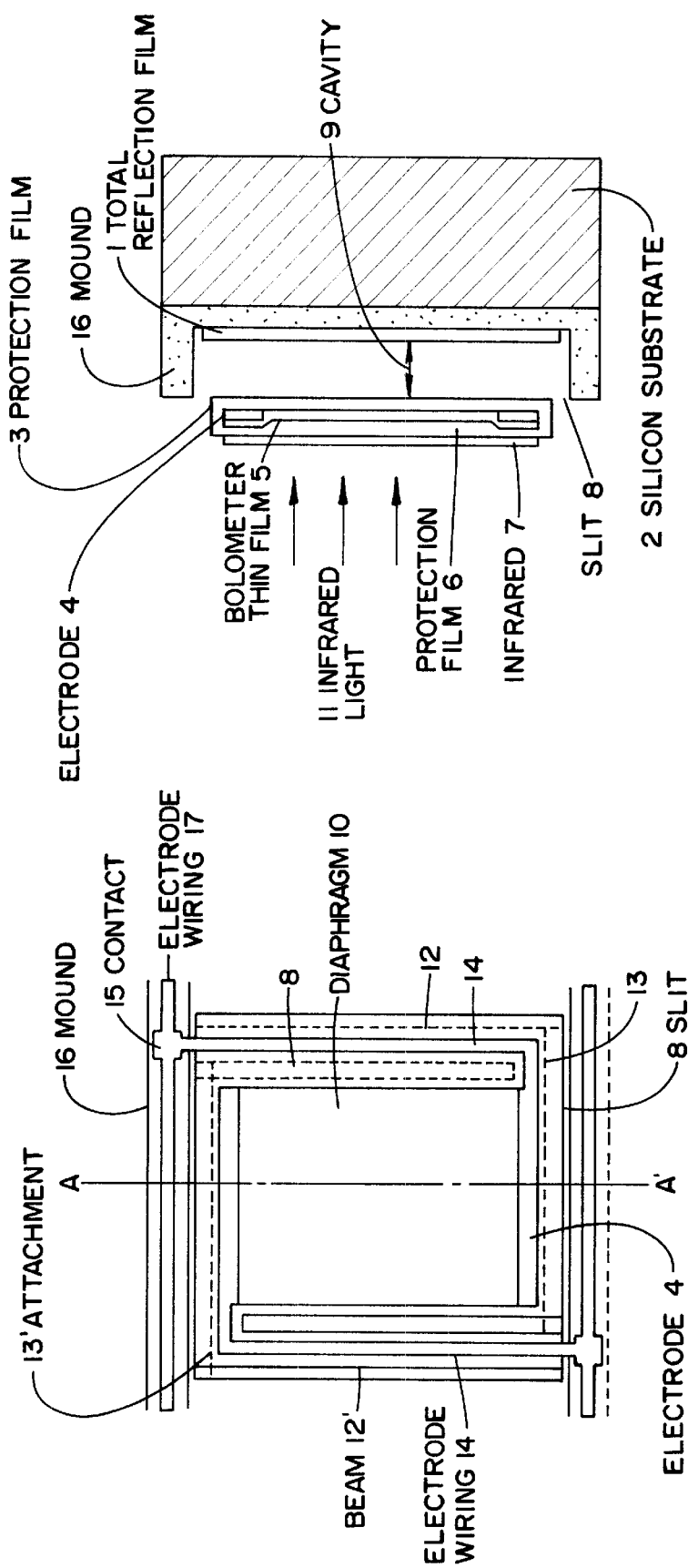

OXIDE THIN FILM FOR BOLOMETER AND INFRARED DETECTOR USING THE OXIDE THIN FILM

FIELD OF THE INVENTION

This invention relates to an oxide thin film for bolometer-type uncooled infrared detector with a small temperature resolution capability.

BACKGROUND OF THE INVENTION

A bolometer uses a thermal variation of resistance in metal or semiconductor thin film that is thermally isolated from a substrate material. Japanese patent application laid-open No. 5-206526 (1993) discloses a technique that n-or p-type doped amorphous silicon (a-Si) is used as a bolometer material. Also, U.S. Pat. No. 5,300,915 discloses a technique that an alloy of nickel-iron is used as a bolometer material.

Characteristics required for bolometer material are a temperature coefficient of resistance (TCR) and a value of resistance. In general, a high resistivity of bolometer material is not suitable since the Johnson noise increases with an increase in resistivity. Also, a low resistivity is not suitable since the difference between the resistivity of wiring except the bolometer and the resistivity of bolometer material becomes small. Thus, it is desirable that the resistivity of bolometer material is about 5 k$\Omega$ to 100 k$\Omega$ at room temperature. In other words, when a formable thickness of bolometer thin film is 0.05 to 1 $\mu$m, it is desirable that a resistivity required for bolometer material is about 0.025 $\Omega$cm to 10 $\Omega$cm.

The temperature resolution capability (NETD: noise equivalent temperature difference) of infrared sensor is inversely proportional to the absolute value of TCR of bolometer material. Therefore, by using a bolometer material with a big absolute value of TCR, an infrared sensor with a small NETD can be obtained. However, as described in prior arts, although n- or p-type doped amorphous silicon has a TCR as high as 3 to 3.5%/K, its resistivity must exceed $1 \times 10^3$ $\Omega$cm.

Although Japanese patent application laid-open No. 5-206526 does not describe, the resistivity of nickel-iron alloy is as small as 40 to 70 $\mu\Omega$cm (referenced from The Metal Handbook). Therefore, it is assumed that its absolute value of TCR is similar to that of another metal with a like resistivity and is not more than 0.5%/K. Thus, such a material is not suitable for bolometer material used for an infrared sensor with a small temperature resolution capability.

As a solution to the above problem, U.S. Pat. No. 5,286,976 discloses an infrared sensor that vanadium oxide or titanium oxide is used as a bolometer material. Although this prior art does not describe about the characteristic of these bolometer materials, for example, Tsuda, "Conductive Oxide", Shokabo Shuppan, p.24 exhibits graphs illustrating the thermal variation of resistivity about vanadium oxide ($V_2O_3$ etc.) and titanium oxide ($Ti_2O_3$ etc.). Although these graphs do not relate to thin films, it is assumed that a suitable resistivity and a big TCR can be obtained by setting a suitable temperature. However, near at room temperature, the resistivity and TCR are not always suitable.

Japanese patent application laid-open No. 9-257565 (1997) discloses a technique that applies vanadium oxide, which incurs no phase transition from below the freezing point to over 100° C., to bolometer thin film. This prior art describes that its application to infrared sensor is advantageous in that the absolute value of TCR exceeds 1%/K and no variation in volume occurs. However, the absolute value of a TCR obtainable is limited.

In many of oxides with conductivity, there exists a temperature region that a big TCR with phase transition is exhibited at a certain temperature. A technique that shifts the temperature region with a big TCR to room temperature by doping a suitable material is reported. For example, S. Koide et al., "Preparation of Doped $VO_2$ Single Crystals and Their Electrical Properties", Applied Physics, Vol.37, No.9, pp.815–820 (1968) reports that transition temperature is shifted by doping titanium (Ti), niobium (Nb), silicon (Si), germanium (Ge) or tin (Sn) into single crystal of vanadium oxide ($VO_2$)

Also, C. B. Greenberg, "Undoped and Doped $VO_2$ Films Grown from $VO(OC_3H_7)_3$", Thin Solid Films, 110(1983) 73–82 reports that $VO_2$ thin films doped with tungsten, molybdenum and niobium are grown on glass by CVD, thereby the transition temperature can be shifted from near 70° C. for undoped to a lower temperature. In this report, in case of W 1.4 mol % doping, the transition temperature is about 40° C., the resistivity is 1.1 $\Omega$cm, and TCR =−5.5%/K. Also, in case of Mo 1.8 mol % doping, the transition temperature is about 50° C., the resistivity is 0.3 $\Omega$cm, and TCR =−9%/K. It is reported that these materials are used in applications to a critical temperature thermistor or near-IR switching element. In this regard, it may be assumed that to apply vanadium oxide doped with another element to thin film for bolometer facilitates, in calculation, to give a reduced noise and to give a temperature resolution capability smaller than that in prior art, but there is no literature reporting such application. Measuring the temperature dependency of resistance in Mo-doped vanadium oxide thin film, there is a difference between resistivities in the rising and falling of temperature. In other words, the thermal hysteresis of resistivity is observed. This is an unsuitable characteristic to bolometer material for infrared sensor.

T. E. Phillips et al., Materials Research Bulletin (1987) p.1113 reports that Fe-doped $VO_2$ thin film is formed on a glass substrate by reactive sputtering, and its electrical resistance and transition temperature observed from resistivity are tested. In this report, the resistivity is 1 to 10 $\Omega$cm near (35° C.) at room temperature. Thus, the resistivity is too high for bolometer thin film. In fact, an application to bolometer thin film for infrared sensor is not suggested in this report.

SUMMARY OF THE INVENTION

Accordingly, it is an object of the invention to provide an oxide thin film for bolometer that offers a low resistivity and a large TCR value.

It is a further object of the invention to provide an infrared sensor that offers a finer temperature resolution capability (NETD).

According to the invention, an oxide thin film for bolometer, comprises:

a vanadium oxide represented by $VO_x$, where x satisfies $1.5 \leq x \leq 2.0$, wherein part of vanadium in the vanadium oxide is substituted by metal ion M, where the metal ion M is composed of at least one of chromium (Cr), aluminum (Al), iron (Fe), manganese (Mn), niobium (Nb), tantalum (Ta) and titanium (Ti).

According to another aspect of the invention, an infrared sensor, comprises:

a bolometer;

wherein the bolometer is of oxide thin film that comprises a vanadium oxide represented by $VO_x$, where x satisfies $1.5 \leq x \leq 2.0$, wherein part of vanadium in the vanadium oxide is substituted by metal ion M, where the metal ion M is composed of at least one of chromium (Cr), aluminum (Al), iron (Fe), manganese (Mn), niobium (Nb), tantalum (Ta) and titanium (Ti).

BRIEF DESCRIPTION OF THE DRAWINGS

The invention will be explained in more detail in conjunction with the appended drawings, wherein:

FIG. 8A is a top view showing an infrared sensor using bolometer thin film of oxide thin film of the invention, and FIG. 8B is a cross sectional view cut along the line A–A' in FIG. 8A.

DESCRIPTION OF THE PREFERRED EMBODIMENTS

Figure 1:
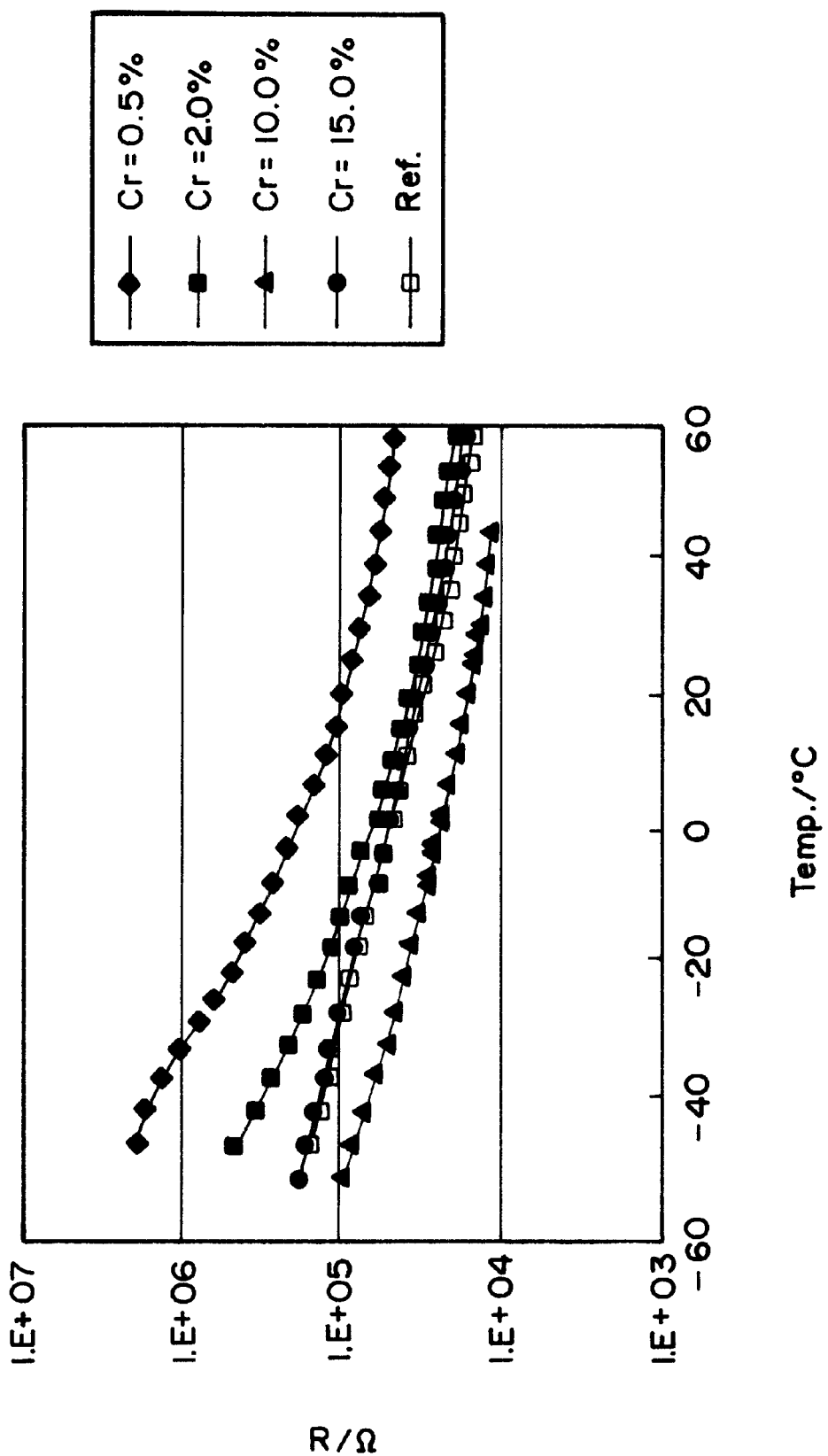
FIG. 1 is a graph showing the temperature dependency of sheet resistance in oxide thin films with compositions of $V_{0.995}Cr_{0.005}O_{3/2}$, $V_{0.98}Cr_{0.02}O_{3/2}$, $V_{0.9}Cr_{0.1}O_{3/2}$ and $V_{0.85}Cr_{0.15}O_{3/2}$.
Figure 2:
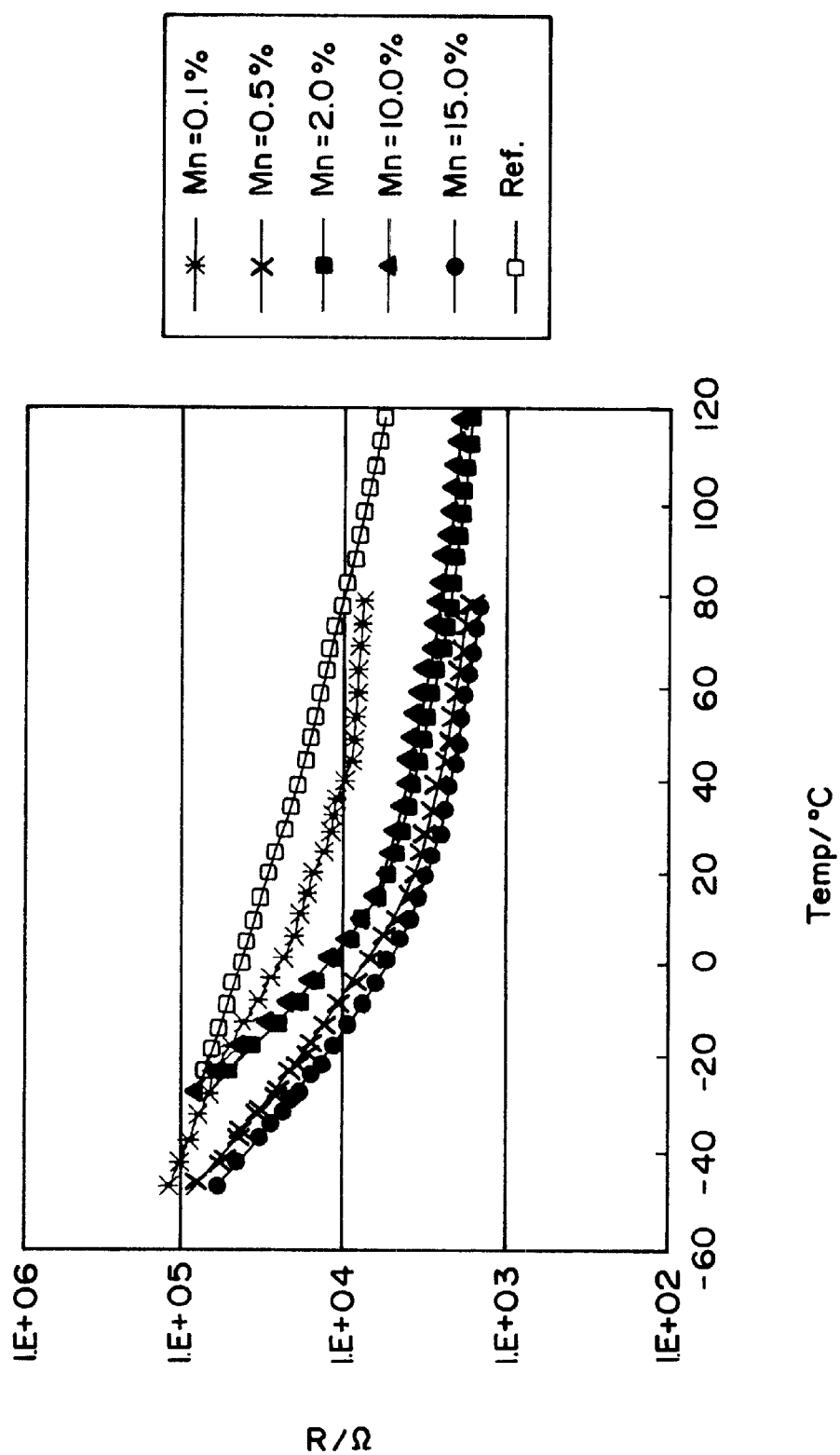
FIG. 2 is a graph showing the temperature dependency of sheet resistance in oxide thin films with compositions of $V_{0.999}Mn_{0.001}O_2$, $V_{0.995}Mn_{0.005}O_2$, $V_{0.98}Mn_{0.02}O_2$, $V_{0.9}Mn_{0.1}O_2$ and $V_{0.85}Mn_{0.15}O_2$.
Figure 3:
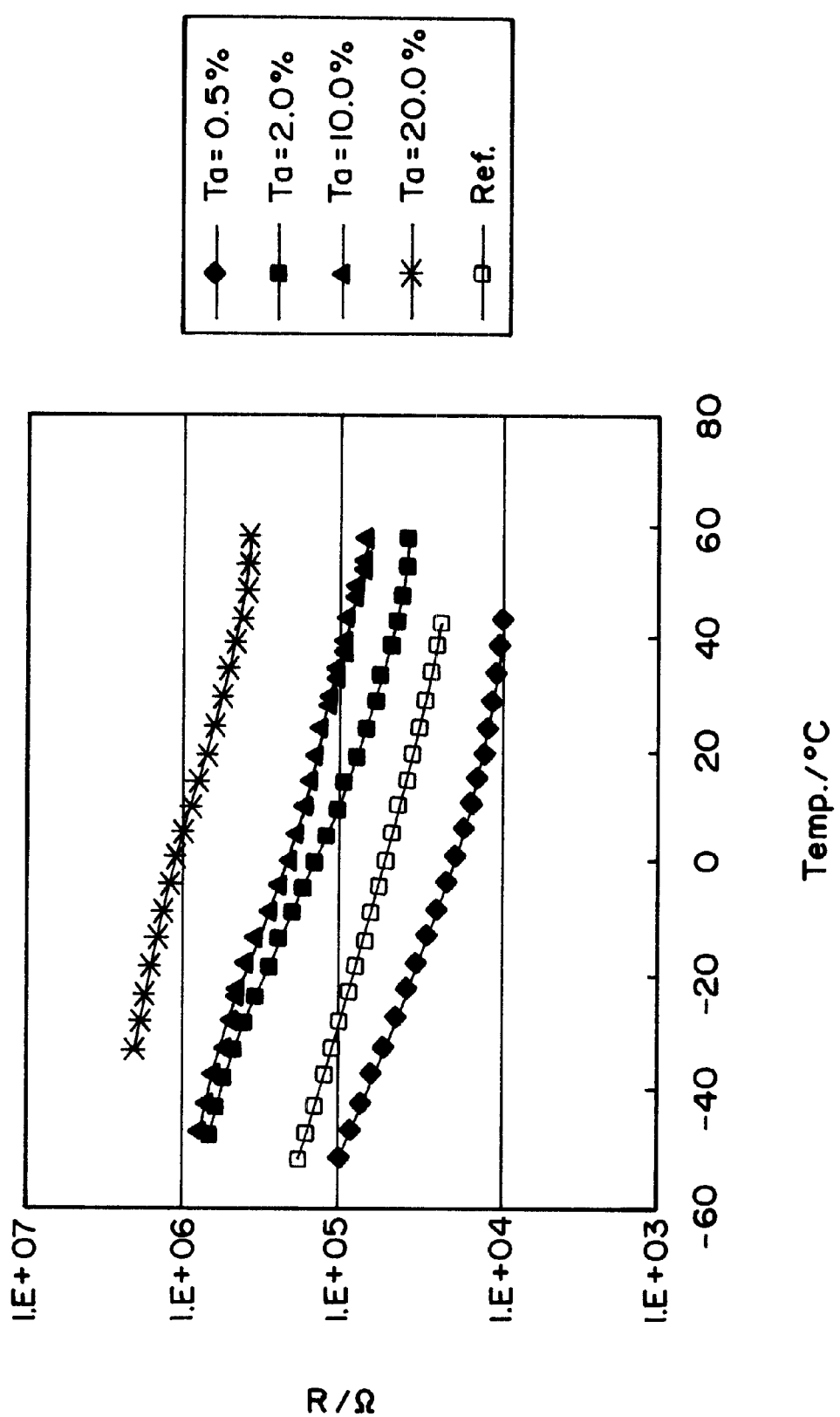
FIG. 3 is a graph showing the temperature dependency of sheet resistance in oxide thin films with compositions of $V_{0.995}Ta_{0.005}O_2$, $V_{0.98}Ta_{0.02}O_2$, $V_{0.9}Ta_{0.1}O_{3/2}$ and $V_{0.8}Ta_{0.2}O_{3/2}$.
Figure 4:
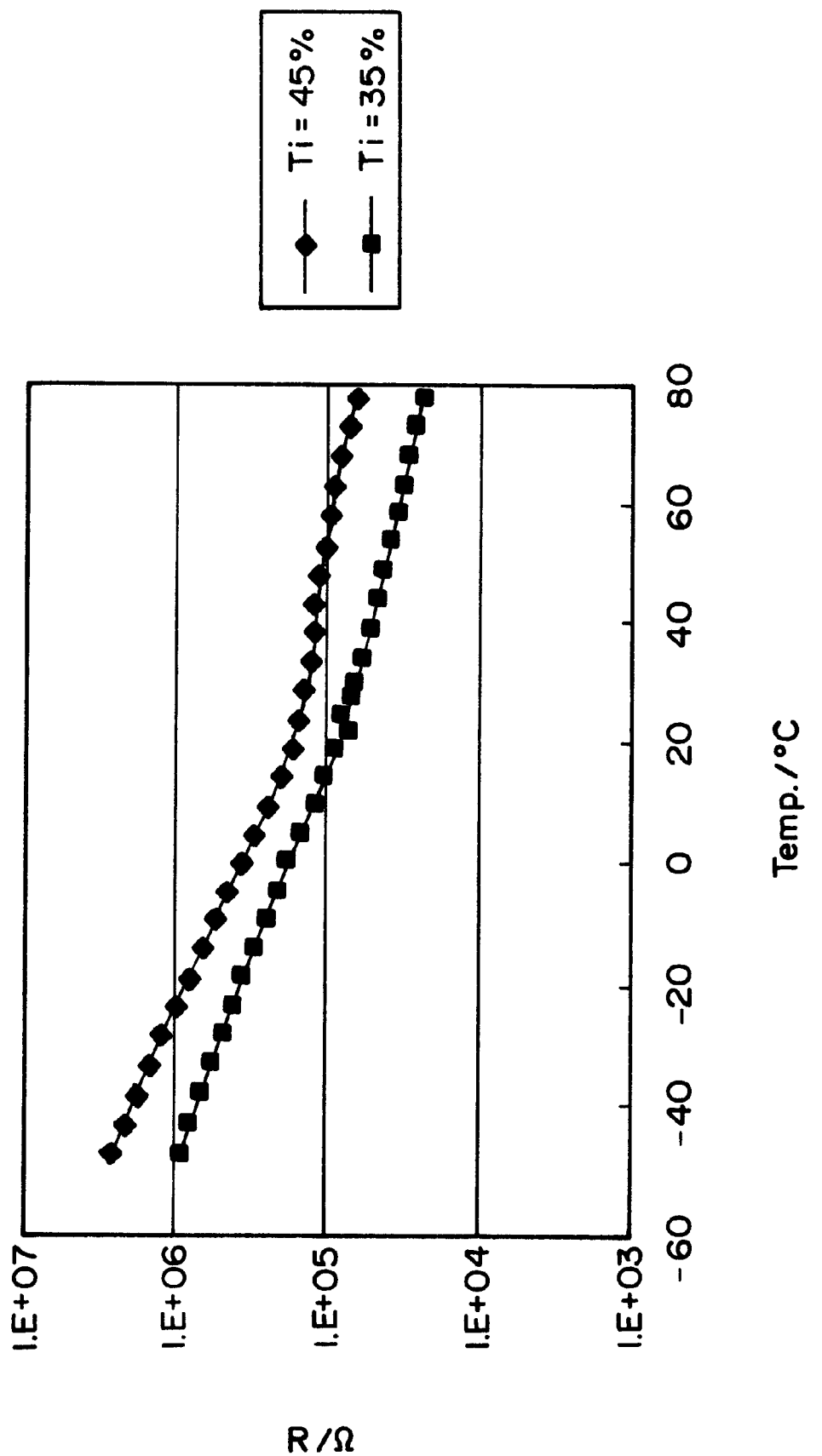
FIG. 4 is a graph showing the temperature dependency of sheet resistance in oxide thin films with compositions of $V_{0.65}Ti_{0.35}O_2$ and $V_{0.55}Ti_{0.45}O_2$.

The preferred embodiments will be explained below referring to the drawings.

Oxide thin film for bolometer in this invention is suitable for a non-cooling type infrared sensor with a small temperature resolution capability. Its manufacturing process is as follows: First, on the surface of a target on which film is formed, e.g. silicon (Si) wafer, thin thermal oxidation film is formed. Then, oxide thin film of vanadium oxide and metal ion described earlier is formed by sol-gel process or sputtering.

The composition of oxides is $1.5 \leq x \leq 2.0$ and $0.001 \leq a \leq 0.1$, preferably x=1.5 or x=2.0 and $0.0025 \leq a \leq 0.05$ for the oxide represented by $V_{1-a}M_aO_x$, where a is a substitute ratio and M is at least one of aluminum, iron, manganese, niobium and tantalum. If a valence of vanadium ion in vanadium oxides is more than quaternary (x=2), e.g. $V_2O_5$, then the resistivity is too high.

Also, if the valence is less than ternary (x=1.5), e.g. VO, then a temperature region (transition point) where a large TCR is obtained is shifted to an extremely low temperature. Thus, both are insufficient. In the embodiments the valence of vanadium in vanadium oxides is limited to ternary or quaternary, but intermediate vanadium oxides, e.g. so-called Magneli phase (composition formula: $V_nO_{2n-1}$) such as $V_3O_5$ and $V_4O_7$, are also sufficient.

By substituting another metal for vanadium ion in vanadium oxides, an effect to improve the problem described earlier can be recognized. However, if the substitute ratio of metal substituted for vanadium ion is less than a range of substitute ratio defined in claim 2 or claim 3 attached herein, then the temperature region where a large TCR is obtained is deviated from near room temperature. If the substitute ratio is more than the range of substitute ratio defined in claim 2 or claim 3, then the resistance abruptly increases. Further, there also occurs a problem that a temperature of oxide crystal formation increases. In any case, the improvement effect must be reduced.

On the other hand, the lower limit value of substitute ratio in claim 2 is based on that both the resistivity and the TCR of oxide thin film with a composition that is substituted by 0.1% Mn in Table 1 are improved (a small resistivity and a large absolute value of TCR are obtained). Since the trend of improvement is recognized even for an ultra-micro substitute as little as 0.1%, it may be expected that the resistivity and the TCR are also improved for a further little substitute. However, in examples described later, a substitute of less than 0.1% is not considered.

The thickness of oxide thin film is preferably 0.05 $\mu$m or more and 1 $\mu$m or less, more preferably, 0.1 $\mu$m or more and 0.5 $\mu$m or less. The thin film formed is annealed with oxygen flow in a diffusion furnace. The annealing is conducted preferably at 400 to 450° C. for 1 to 3 hours.

The sample annealed is put into a vacuum batch furnace, vacuumed by a diffusion pump, reduced introducing a reducing gas including hydrogen into the furnace. The gas is a mixed gas composed of 70% argon and 30% hydrogen. It is preferable that the temperature of treatment is 350 to 450° C. (450 to 550° C. only when substituting with titanium) and the treatment time is 12 to 36 hours.

FIGS. 8A and 8B show a compositional example of an infrared sensor manufactured using the oxide thin film as bolometer thin film. The infrared sensor shown has a microbridge structure. Namely, it is structured so that the bolometer thin film is thermally separated from a silicon substrate through a clearance and is supported by beams of silicon nitride ($SiN_x$) etc.

Referring to FIGS. 8A and 8B, the composition is further detailed. FIG. 8A is a front view of the infrared sensor, FIG. 8B is a cross sectional view cut along the line A–A' in FIG. 8A. As shown in FIG. 8B, there is provided a mound 16 which is structured so that covers the front surface of the substrate and protrudes along the upper and lower edges. Inside the concave portion of the mound 16, and a total reflection film 1 is formed so that covers the entire concave portion.

Further, there is provided a laminated film in parallel to the total reflection film 1, apart from the edges of the mound 16. The laminated film is laminated by, in sequence from the substrate side, a protection film 3, electrodes 4 on the upper and lower sides, a bolometer thin film 5, a protection film 6 and an infrared absorption film 7.

These are supported connected to the mound 16 by the beams 12, 12' and attachments 13, 13' shown in FIG. 8A. A cavity 9 formed between the laminated film and the substrate 2 and total reflection film 1 functions so that the bolometer thin film 5 is thermally isolated from the silicon substrate 2. Also, there is provided slits 8 between part including the bolometer thin film 5 and the protruding edges of the mound 16 or the beams 12, 12'. A diaphragm 10 is part that includes the laminated film composed of the protection films 3, 6, bolometer thin film 5, and infrared absorption film 7, the opposed total reflection film 1 and the cavity 9 formed therebetween. The micro-bridge structure is as described above.

The power source is externally supplied through an electrode wiring 17 formed on the mound 16, branched at a contact 15 to connect to the electrode 4 through an electrode wiring 14 on the beam 12, 12'. The function of infrared sensor is explained in FIG. 8B. Infrared light 11 is supplied to a cell, absorbed by the infrared absorption film 7 at first. A part of infrared light transmitted is reflected by the reflection film 1 at the bottom of the diaphragm 10, therefore the infrared light 11 results in being completely absorbed into the infrared absorption film 7. Infrared light absorbed radiates heat, thereby the diaphragm 10 is heated and the resistance of the bolometer thin film 5 varies.

EMBODIMENT 1

Oxide thin film in the first preferred embodiment according to the invention is manufactured using the following process. First, 0.2 $\mu$m thermal oxidation film (SiO$_2$) is formed on a 511 surface of silicon wafer, then oxide thin film of a composition represented by $V_{1-a}M_aO_x$ on the thermal oxidation film is formed by the sol-gel process. The thickness of oxide thin films is set to be 0.1 $\mu$m. The list of oxide thin films formed is shown in Table 1. The antecedent solution used to make the oxide thin films is prepared by the following process.

As a raw material for V (vanadium), trialkoxyvanadyl (general formula: VO(OR)$_3$, where R is alkyl group with C=1 to 4) is used. As a metal material to substitute for vanadium, organic metal oxide represented by a form substituting alkoxide, acetylacetone, 2-ethylhexanoic acid etc. for oxygen of the corresponding metal oxide is used.

At a nitrogen-substituted ambient atmosphere, measuring trialkoxyvanadyl and the organic metal oxide into an organic solvent so as to have a composition in Table 1, refluxing them in an oil bath of 80 to 120° C. for 12 to 24 hours, thereby the precursor solution is obtained.

As the organic solvent, selected is at least one of lower alcohol with C=1 to 3, methoxyethanol, ethoxyethanol, methoxypropanol, ethoxypropanol, methylacetate, ethylacetate, isopropylacetate, toluene, xylene, hexane. When some kinds of the above compounds are selected as the solvent, the selection is conducted so that the solubility, boiling point and wettability to the substrate surface of organic metal oxide are most suitable.

Also, according to need, a small amount of catalyzer such as water, acids and alkalis, a thickener such as ethyleneglycol and hydroxypropylcellulose, and a stabilizer such as $\beta$-diketone, e.g. acetylacetone are used.

Diluting the precursor solution into a suitable concentration, thin film is formed on the substrate by spin coating or the like. The thin film formed is annealed with oxygen flow in a diffusion furnace at 400° C. for 1 hour. Then, the sample annealed is put into a vacuum batch furnace, vacuumed by a diffusion pump, reduced introducing a mixed gas of 70% argon and 30% hydrogen into the furnace at 400 to 450° C. (except when substituting with titanium) for 12 to 36 hours.

For vanadium oxide to be substituted with titanium, since the amount of vanadium substituted is large, the annealing temperature is made to be 500 to 550° C. while introducing a smaller amount of argon-hydrogen mixed gas than a composition substituted with another element.

Although, in this embodiment, the oxide thin film for bolometer is formed by the sol-gel process, it may be formed by sputtering that uses an alloy of V (vanadium) and metal substituted for V as a target, or V and another metal or metal oxide as a target. For the thin film for bolometer formed on the silicon substrate formed with the thermal oxidation film, the crystal phase is identified by the X-ray diffraction method, the temperature characteristic of resistance (sheet resistance) is measured by the two terminal method. In order to minimize the dispersion among the samples in the measurement and to secure the ohmic contact between the oxide thin film and conductor, two 1 mm-square gold electrodes are formed at interval of 10 mm on the oxide thin film by sputtering, connecting the conductors thereto using a conductive paste (silver). When the thickness of oxide thin films formed is measured by using a contact probe type surface roughness meter, the thickness of all oxide thin films was in the range of 0.1 to 0.15 $\mu$m.

Table 1 shows the composition formula of samples tested, the amount of impurity oxide substituting for vanadium ion, the crystal phase of basic vanadium oxide, the resistivity (converted by sheet resistance/film thickness) at 20° C., and the TCR value.

Figure 5:
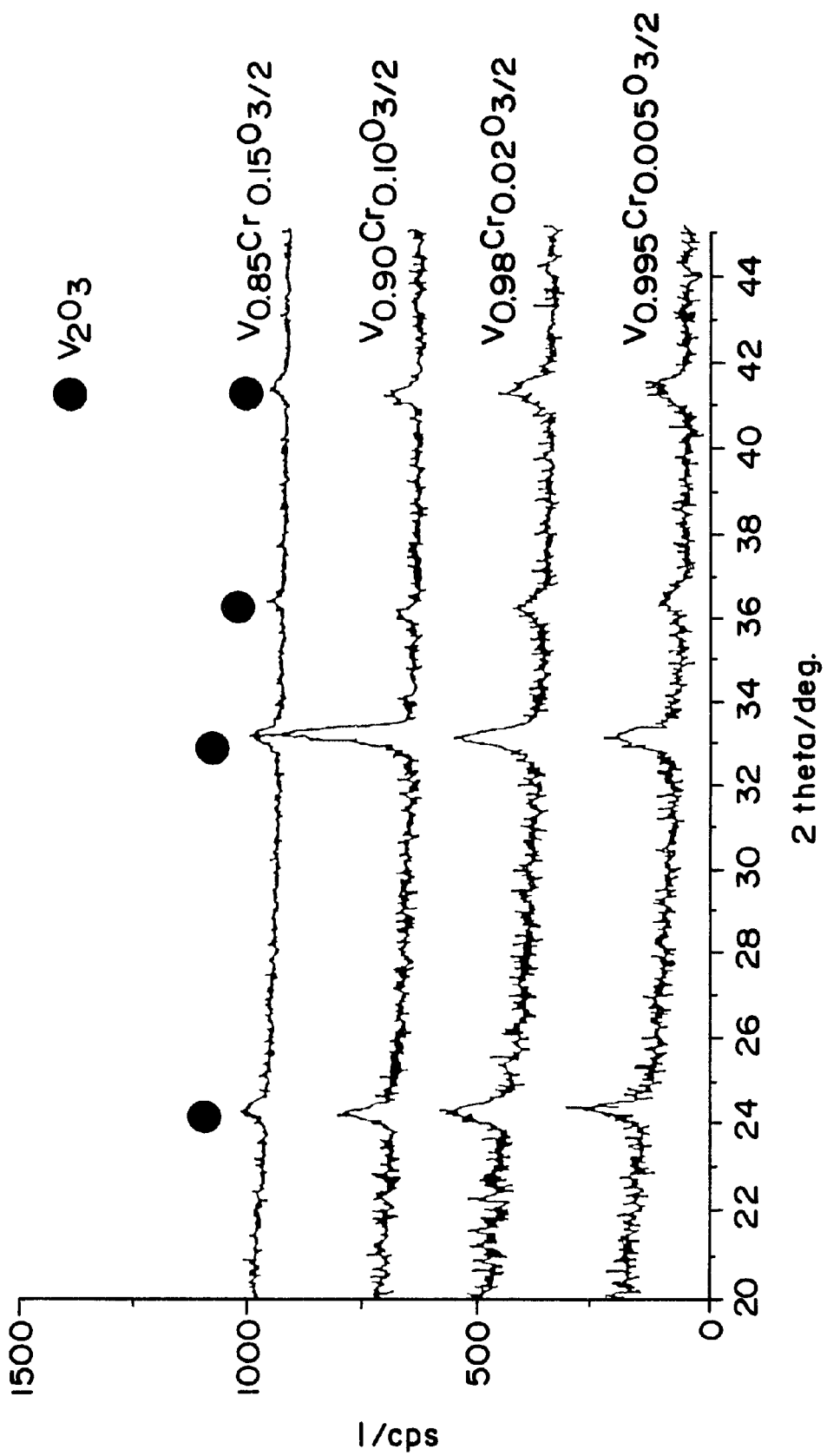
FIG. 5 is a graph showing the X-ray diffraction measurements of oxide thin films with compositions of $V_{0.995}Cr_{0.005}O_{3/2}$, $V_{0.98}Cr_{0.02}O_{3/2}$, $V_{0.9}Cr_{0.1}O_{3/2}$ and $V_{0.85}Cr_{0.15}O_{3/2}$.
Figure 6:
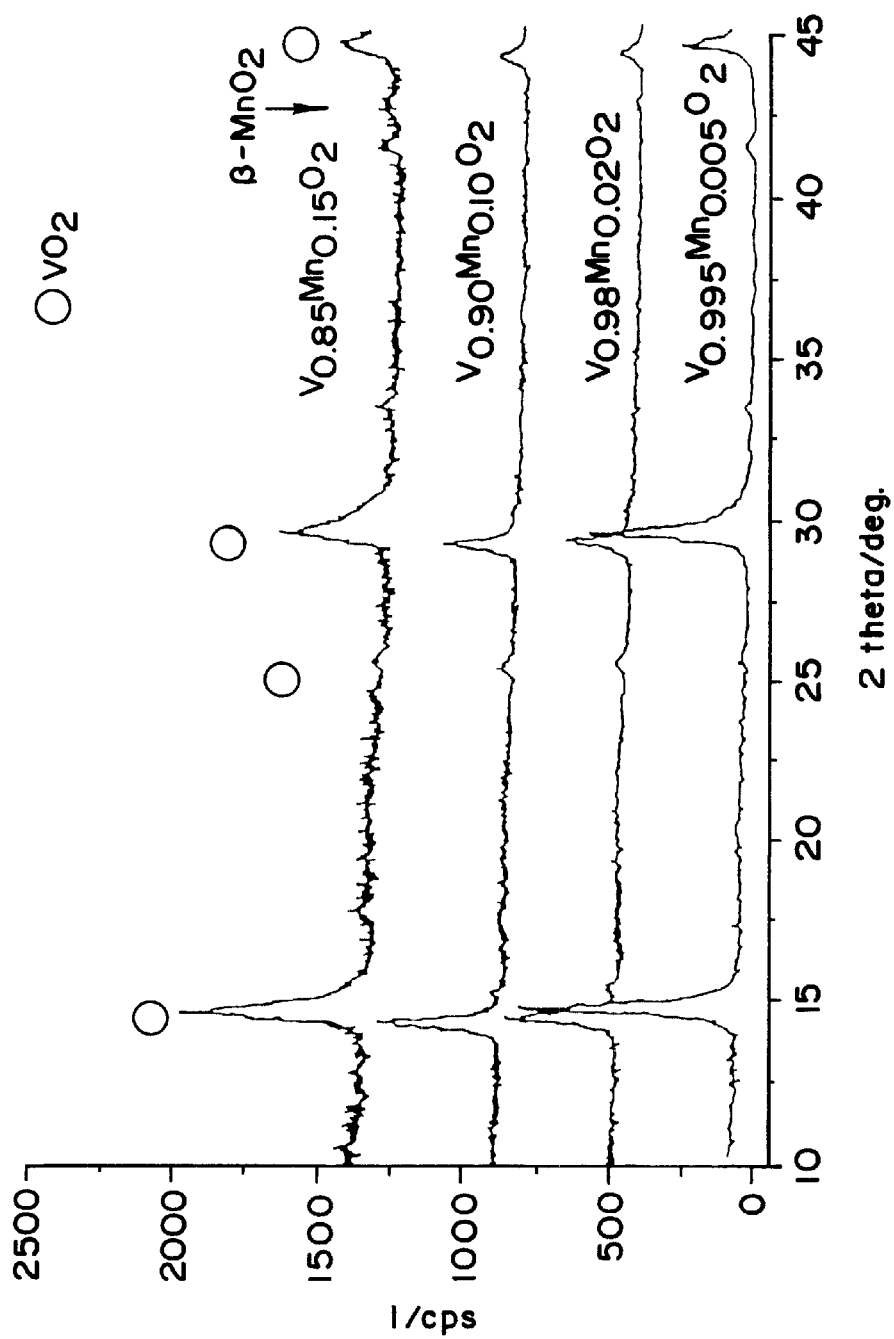
FIG. 6 is a graph showing the X-ray diffraction measurements of oxide thin films with compositions of $V_{0.999}Mn_{0.001}O_2$, $V_{0.995}Mn_{0.005}O_2$, $V_{0.98}Mn_{0.02}O_2$, $V_{0.9}Mn_{0.1}O_2$ and $V_{0.85}Mn_{0.15}O_2$.
Figure 7:
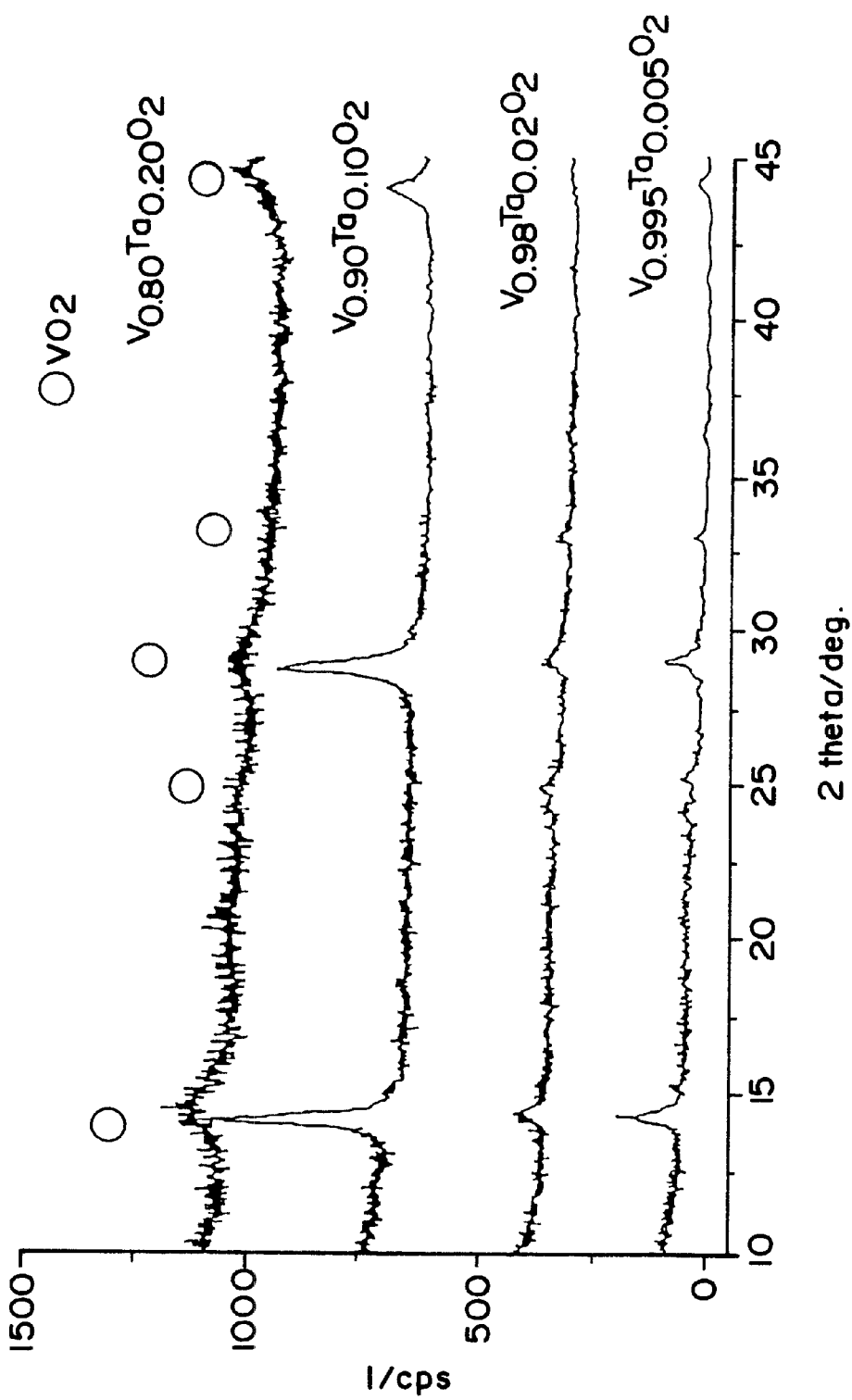
FIG. 7 is a graph showing the X-ray diffraction measurements of oxide thin films with compositions of $V_{0.995}Ta_{0.005}O_2$, $V_{0.98}Ta_{0.02}O_2$, $V_{0.9}Ta_{0.1}O_{3/2}$ and $V_{0.8}Ta_{0.2}O_{3/2}$.

Also, as the typical examples, for oxide thin films with compositions substituted with chromium, manganese, tantalum and titanium, the temperature dependencies of sheet resistance are shown in FIGS. 1 to 4 and the X-ray diffraction measurements are shown in FIGS. 5 to 7.

This embodiment is further detailed referring to Table 1 and FIGS. 1 to 7.

When part of vanadium ion ($V^{4+}$ or $V^{3+}$) in vanadium oxide is substituted by chromium ion ($Cr^{3+}$) or aluminum ion ($Al^{3+}$), the skeletal crystal structure is the same as that of $V_2O_3$ (FIG. 5)

When substituting with $Cr^{3+}$ to 10%, the sheet resistance keeps a desired value of 17 to 90 k$\Omega$ (resistivity: 0.17 to 0.9 $\Omega$cm) and the absolute value of TCR also exceeds 2%/K. When further substituting to 15%, the resistivity increases and the absolute value of TCR further reduces. Therefore, a further substitution is undesirable. Nonetheless, the resistivity is higher than that of vanadium oxide in comparative example 1 (vanadium oxide in Japanese patent application laid-open No. 9-257565, which is hereinafter referred to as $VO_2'$). Also when substituting with $Al^{3+}$, it is proved that the same effects are obtained. Despite that the resistivity is further lower than that in substitution with $Cr^{3+}$, the absolute values of TCR keep more than 2%/K.

When part of vanadium ion is substituted by manganese ion ($Mn^{3+}$or $Mn^{4+}$), the crystal structure is the same as that of $VO_2'$ (FIG. 6).

When the substitution amount of manganese ion is 10% or less, the sheet resistance is 4 to 8 k$\Omega$ (0.04 to 0.08 $\Omega$cm), the absolute value of TCR is 3%/K, especially as large as more than 4%/K in some composition. When substituting with manganese ion to 15%, a peak of $\beta$-$MnO_2$ is found. This indicates that when substituting for vanadium ion with 10% or more manganese ion, the second phase generates exceeding the solution limit.

Meanwhile, since the manganese precipitated is quaternary, it is probable that the manganese ion substituted is not ternary but quaternary. However, it is not proved certainly.

As compared with these compositions, in compositions substituted by iron ion, tantalum ion, niobium ion and titanium ion, the resistivity is relatively high. However, it falls within a tolerance to bolometer thin film and the absolute values of TCR are almost more than 2%/K.

When substituting for vanadium ion with 10% or more tantalum ion or niobium ion, the temperature of reducing thermal treatment is set to be 20 to 50° C. higher than that of the other composition and the crystal structure is made to be $V_2O_3$. This is because the resistivity may exceed a tolerance to bolometer thin film if it keeps the same crystal structure as $VO_2'$. In substituting with tantalum, the X-ray diffraction peaks of thin films are much smaller than those of Cr and Mn, it is therefore assumed that the crystallization is harmed (FIG. 7).

Referring to FIGS. 1 to 4, the temperature characteristics of non-substituted $VO_2'$ show almost lines in the range of −50 to 80 or 120° C. in logR-T curves. Different from this, the temperature characteristics of oxide in substituting for vanadium ion with the other elements have a slightly steep slope at a temperature (0 to 20° C.) lower than room temperature. However, such a difference matters little in practical use.

COMPARATIVE EXAMPLES

Values of $VO_2'$ (sample A) that is not substituted by the other element, and $V_6O_{13}$ (sample B), VO (sample C) that the valence falls outside the scope of the invention are also described in Table 1. For $VO_2'$ actual measurements of 0.1 μm thin film are described, and for the other two samples literature values are described.

TABLE 1

| Sample No. | Composition Formula | M | a | x | resistivity (Ω cm) | TCR (%/K) |
|---|---|---|---|---|---|---|
| EMBODIMENT 1 | | | | | | |
| 1 | $V_{0.995}Cr_{0.005}O_{3/2}$ | Cr | 0.005 | 1.5 | 0.9 | −3.1 |
| 2 | $V_{0.98}Cr_{0.02}O_{3/2}$ | Cr | 0.02 | 1.5 | 0.37 | −2.5 |
| 3 | $V_{0.9}Cr_{0.1}O_{3/2}$ | Cr | 0.1 | 1.5 | 0.17 | −2.05 |
| 4 | $V_{0.085}Cr_{0.15}O_{3/2}$ | Cr | 0.15 | 1.5 | 0.28 | −1.98 |
| 5 | $V_{0.995}Al_{0.005}O_{3/2}$ | Al | 0.005 | 1.5 | 0.02 | −2.01 |
| 6 | $V_{0.98}Al_{0.02}O_{3/2}$ | Al | 0.02 | 1.5 | 0.05 | −2.43 |
| 7 | $V_{0.95}Al_{0.05}O_{3/2}$ | Al | 0.05 | 1.5 | 0.06 | −2.35 |
| 8 | $V_{0.995}Fe_{0.005}O_2$ | Fe | 0.005 | 2.0 | 1.82 | −2.14 |
| 9 | $V_{0.98}Fe_{0.02}O_2$ | Fe | 0.02 | 2.0 | 0.98 | −3.07 |
| 10 | $V_{0.9}Fe_{0.1}O_2$ | Fe | 0.1 | 2.0 | 0.77 | −2.55 |
| 11 | $V_{0.999}Mn_{0.001}O_2$ | Mn | 0.001 | 2.0 | 0.15 | −1.95 |
| 12 | $V_{0.995}Mn_{0.005}O_2$ | Mn | 0.005 | 2.0 | 0.04 | −3.20 |
| 13 | $V_{0.98}Mn_{0.02}O_2$ | Mn | 0.02 | 2.0 | 0.06 | −4.15 |
| 14 | $V_{0.90}Mn_{0.1}O_2$ | Mn | 0.1 | 2.0 | 0.08 | −4.02 |
| 15 | $V_{0.85}Mn_{0.15}O_2$ | Mn | 0.15 | 2.0 | 003 | −2.95 |
| 16 | $V_{0.995}Ta_{0.005}O_2$ | Ta | 0.005 | 2.0 | 0.13 | −2.03 |
| 17 | $V_{0.98}Ta_{0.02}O_2$ | Ta | 0.02 | 2.0 | 0.77 | −2.64 |
| 18 | $V_{0.9}Ta_{0.1}O_{3/2}$ | Ta | 0.1 | 1.5 | 1.35 | −1.98 |
| 19 | $V_{0.8}Ta_{0.2}O_{3/2}$ | Ta | 0.2 | 1.5 | 6.9 | −2.55 |
| 20 | $V_{0.995}Nb_{0.005}O_2$ | Nb | 0.005 | 2.0 | 0.6 | −2.11 |
| 21 | $V_{0.98}Nb_{0.02}O_2$ | Nb | 0.02 | 2.0 | 1.7 | −2.31 |
| 22 | $V_{0.9}Nb_{0.1}O_{3/2}$ | Nb | 0.1 | 1.5 | 5 | −2.73 |
| 23 | $V_{0.65}Ti_{0.35}O_2$ | Ti | 0.35 | 2.0 | 0.8 | −2.40 |
| 24 | $V_{0.055}Ti_{0.45}O_2$ | Ti | 0.45 | 2.0 | 1.6 | −2.10 |
| COMPARATIVE EXAMPLE 1 | | | | | | |
| A | $VO_2'$ | | | | 0.33 | −1.8 |
| B | $V_6O_{13}$ | | | | about 1000 | −1.1 |
| C | VO | | | | 0.008 | ~0 |

EMBODIMENT 2

Using the oxide thin film in the first embodiment described above as a bolometer thin film, an infrared sensor is manufactured by the following process. In FIGS. 8A and 8B, on the Si wafer 2 installed with a read-out circuit (not shown), the reflection film 1 of metal, e.g. WSi, with a high reflectivity at infrared zone is formed. On the reflection film 1, a sacrifice layer of e.g. polysilicon film is formed at the future place for the cavity 9. On the sacrifice layer, protection film 3 as an insulating film of SiN or $SiO_2$ is formed by plasma CVD. Then, metal with a small thermal conductivity, e.g. Ti, is formed on the protection film 3 by sputtering. The electrode wiring 14 is formed by exposure, development and etching.

On these films, the oxide thin film in the first embodiment is formed by sol-gel process to give bolometer thin film 5. On the bolometer thin film 5, protection film 6 is formed using the same method as the protection film 3. On the protection film 6, infrared absorption film 7 of e.g. TiN is formed by reactive sputtering.

After forming the infrared absorption film 7, slit 8 are formed. Then, the sacrifice layer is wet-etched by e.g. hydrazine to give the cavity 9. By the above process, the diaphragm 10 with a hang-in-midair structure is formed. The cell thus obtained is shown by the top view in FIG. 8A and by the cross sectional view in FIG. 8B.

The principle that the cell operates as an infrared detector is as follows: Infrared light 11 is supplied to a cell, absorbed by the infrared absorption film 7 at first. A part of infrared light transmitted is reflected by the reflection film 1 at the bottom of the diaphragm 10, therefore the infrared light 11 results in being completely absorbed into the infrared absorption film 7. Infrared light absorbed radiates heat, thereby the diaphragm 10 is heated and the resistance of the bolometer thin film 5 varies.

When the cell size of the infrared sensor is 50 μm square and the sheet resistance is 20 kΩ, and the 1/f noise K value is $2 \times 10^{-12}$, the temperature resolution capability (NETD) is reduced to 0.03° C. since the resistivity is about a fifth of that of the conventional non-substituted vanadium and the 1/f noise also reduces when sample 13 (Mn 2% substituted) in Table 1 in the first embodiment of the invention is used. In contrast with this, NETD is about 0.1° C. in calculation when the conventional non-substituted vanadium is used as the bolometer thin film.

When the cell area reduces for the same bolometer thin films, NETD increases, i.e. the temperature resolution capability of infrared sensor deteriorates. However, when the bolometer thin film of the invention is used, NETD can be kept at about 0.1° C., which is equal to the conventional level, or less theoretically. The above calculations are performed in reference to Proceeding of SPIE, 1998, pp.90–100.

ADVANTAGES OF THE INVENTION

By using the oxide of the invention for bolometer thin film, the resistance value of bolometer thin film can be made to be a suitable value, i.e. 5 to 100 kΩ, near at room temperature. Also, the oxide thin film of the invention offers an absolute value of TCR of almost more than 2%/K, in some compositions a value as high as more than 4%/K. In detail, these values can be higher than TCR (−1.8%/K) in vanadium oxides that no impurity oxide is introduced.

Thus, by using the oxide thin film of the invention for bolometer thin film, the temperature resolution capability can be enhanced.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An oxide thin film for bolometer, comprising:
   a vanadium oxide represented by $VO_x$, where x satisfies $1.5 \leq x \leq 2.0$,
   wherein part of vanadium ion in said vanadium oxide is substituted by metal ion M, where said metal ion M is composed of at least one of, aluminum (Al), iron (Fe), manganese (Mn), and tantalum (Ta).

2. An oxide thin film, according to claim 1, wherein:
   said vanadium oxide substituted by metal ion M is represented by $V_{1-a}M_aO_x$, where sad metal ion M substituted is composed of at least one of aluminum (Al), iron (Fe), manganese (Mn), and tantalum (Ta), a is a substitute ratio of said metal ion M, and a and x satisfy $0.001 \leq a \leq 0.1$ and $1.5 \leq x \leq 2.0$, respectively.

3. An oxide thin film for bolometer, comprising:
   a vanadium oxide represented by $VO_x$, where x satisfies $1.5 < x \leq 2.0$,
   wherein part of the vanadium ion in said vanadium oxide is substituted by chromium (Cr).

4. An oxide thin film according to claim 3, wherein:
   said vanadium oxide substituted by chromium (Cr) ion is represented by $V_{1-a}Cr_aO_x$, a is a substitute ratio of chromium (Cr) ion, and a satisfies $0.001 \leq a \leq 0.1$.

5. An infrared detector, comprising:
   a bolometer;
   wherein said bolometer is of oxide thin film that comprises a vanadium oxide represented by $VO_x$, where x satisfies $1.5 \leq x \leq 2.0$,
   wherein part of the vanadium ion in said vanadium oxide is substituted by metal ion M, where said metal ion M is composed of at least one of the aluminum (Al), iron (Fe), manganese (Mn), and tantalum (Ta).

6. An infrared detector, according to claim 5, wherein:
   said vanadium oxide substituted by metal ion M is represented by $V_{1-a}M_aO_x$, where said metal ion M is composed of at least one of aluminum (Al), iron (Fe), manganese (Mn), and tantalum (Ta), a is a substitute ratio of said metal ion M, and a and x satisfy $0.001 \leq a \leq 0.1$ and $1.5 \leq x \leq 2.0$, respectively.

7. An infrared detector, according to claim 5, wherein:
   said infrared detector has a micro-bridge structure.

8. An infrared detector, comprising:
   a bolometer;
   wherein said bolometer is comprised of an oxide thin film that comprises a vanadium oxide represented by $VO_x$, where x satisfies $1.5 < x \leq 2.0$,
   wherein part of vanadium ion in said vanadium oxide is substituted by chromium (Cr).

9. An infrared detector, according to claim 8, wherein:
   said vanadium oxide substituted by chromium (Cr) ion is represented by $V_{1-a}M_aO_x$, a is a substitute ratio of chromium (Cr) ion, and a satisfies $0.001 \leq a \leq 0.1$.

10. An infrared detector, according to claim 8, wherein:
    said infrared detector has a micro-bridge structure.

11. An oxide thin film for bolometer, comprising:
    a vanadium oxide represented by $VO_x$, where x is 2,
    wherein part of the vanadium ion in said vanadium oxide is substituted by chromium (Cr).

12. An oxide thin film according to claim 11, wherein:
    said vanadium oxide substituted by chromium (Cr) ion is represented by $V_{1-a}Cr_aO_x$, a is a substitute ratio of chromium (Cr) ion, and a satisfies $0.001 \leq a \leq 0.1$.

13. An infrared detector, comprising:
    a bolometer,
    wherein said bolometer is composed of an oxide thin film that comprises a vanadium oxide represented by $VO_x$, where x is 2.0,
    wherein part of vanadium ion in said vanadium oxide is substituted by chromium (Cr).

14. An infrared detector, according to claim 13, wherein:
    said vanadium oxide substituted by chromium (Cr) ion is represented by $V_{1-a}Cr_aOx$, a is a substitute ratio of chromium (Cr) ion, and a satisfies $0.001 \leq a \leq 0.1$.

15. An infrared detector, according to claim 13, wherein:
    said infrared detector has a micro-bridge structure.

* * * * *